(12) United States Patent
Suzuki et al.

(10) Patent No.: US 11,044,838 B2
(45) Date of Patent: Jun. 22, 2021

(54) RAILWAY EQUIPMENT INSPECTING AND MEASURING APPARATUS, AND RAILWAY EQUIPMENT INSPECTING AND MEASURING METHOD

(71) Applicant: HITACHI HIGH-TECH FINE SYSTEMS CORPORATION, Saitama (JP)

(72) Inventors: Hideyasu Suzuki, Tokyo (JP); Takeshi Kurokawa, Tokyo (JP); Tomohiko Kai, Tokyo (JP); Masaki Araki, Saitama (JP); Tomoya Sasaki, Saitama (JP); Takeshi Iga, Saitama (JP); Tomoharu Isozaki, Saitama (JP); Noritake Shizawa, Saitama (JP); Keishin Hamaoka, Saitama (JP); Takahiro Daikoku, Tokyo (JP)

(73) Assignee: HITACHI HIGH-TECH FINE SYSTEMS CORPORATION, Saitama (JP)

( * ) Notice: Subject to any disclaimer, the term of this patent is extended or adjusted under 35 U.S.C. 154(b) by 186 days.

(21) Appl. No.: 16/355,539

(22) Filed: Mar. 15, 2019

(65) Prior Publication Data

US 2019/0297750 A1 Sep. 26, 2019

(30) Foreign Application Priority Data

Mar. 26, 2018 (JP) .............................. JP2018-058197

(51) Int. Cl.
*H05K 7/20* (2006.01)
*B60M 1/13* (2006.01)
(Continued)

(52) U.S. Cl.
CPC ........... *H05K 7/20863* (2013.01); *B60M 1/13* (2013.01); *B60M 1/28* (2013.01); *F25B 21/02* (2013.01);
(Continued)

(58) Field of Classification Search
CPC ........... H05K 7/20863; H05K 7/20845; H05K 7/2089; H05K 7/20909; B60M 1/12; B60M 1/28; B60M 1/13; H01L 23/427
(Continued)

(56) References Cited

U.S. PATENT DOCUMENTS 8,879,259 B2 * 11/2014 Suzuki .................... B61C 17/04
361/700
10,349,562 B2 * 7/2019 Kondo ............... H05K 7/20945

FOREIGN PATENT DOCUMENTS

JP 2012-215414 A 11/2012

* cited by examiner

*Primary Examiner* — Joel M Attey
(74) *Attorney, Agent, or Firm* — Maschoff Brennan

(57) ABSTRACT

Effectively control the temperature of a control unit of a railway equipment inspecting and measuring apparatus, and install the control unit of the railway equipment inspecting and measuring on the roof of the passenger car. The first space is formed between the control unit and the heat insulating case. The second space is formed between the heat insulating case and the cover. In the first space, heat is conducted between the air in the first space and the heat exchange element by the first heat conducting member, and the first fan causes circulation of the air in the first space. In the second space, heat is conducted between the air in the second space and the heat exchange element by the second heat conducting member, and the air inside the second space is diffused by blowing the air from a suction port into the second space with the second fan.

7 Claims, 12 Drawing Sheets

(51) Int. Cl.
  *B60M 1/28* (2006.01)
  *F25B 21/02* (2006.01)
  *B60M 1/12* (2006.01)
(52) U.S. Cl.
  CPC ........... *H05K 7/20945* (2013.01); *B60M 1/12* (2013.01); *H05K 7/2089* (2013.01); *H05K 7/20845* (2013.01); *H05K 7/20909* (2013.01)
(58) Field of Classification Search
  USPC ....................................................... 165/185
  See application file for complete search history.

(a)

(b)

RAILWAY EQUIPMENT INSPECTING AND MEASURING APPARATUS, AND RAILWAY EQUIPMENT INSPECTING AND MEASURING METHOD

FIELD OF THE INVENTION

Present invention relates to a railway equipment inspecting and measuring apparatus and a railway equipment inspecting and measuring method for detecting wear amount of a trolley wire of a railway, state and displacement of rails, etc. or surrounding structures and an obstacles to the operation of railway, and more particularly to a railway equipment inspecting and measuring apparatus and a railway equipment inspecting and measuring method suitable for mouthing in a passenger car of the railway.

BACKGROUND OF THE INVENTION

A pantograph with a collecting shoe is installed on the roof of the railway car (train), and the pantograph collector shoe comes in contact with the trolley in order to supply the electricity to the railway car. The trolley wire wears in contact with the collector shoe, and it is necessary to periodically inspect the trolley wire using a trolley wire inspection apparatus. The trolley wire inspection apparatus for detecting an abrasion amount of a trolley wire, etc. includes a sensor unit for irradiating the trolley wire with inspection light and receiving reflected light from the trolley wire, and a control unit for processing detection signals of the sensor unit and controlling whole equipments of the apparatus. When inspecting the trolley wire, a dedicated inspection car is operated, and the sensor unit of the trolley wire inspection apparatus is installed on the roof of the inspection car, and the control unit is mounted inside the inspection car. As such a trolley wire inspection apparatus, for example, a trolley wire measuring apparatus is described in patent document 1.

RELATED ART STATEMENT

Patent Document

[Patent Document 1] JPA 2012-215414

SUMMARY OF THE INVENTION

Object of the Invention

There is a demand to investigate the wear amount data of the trolley wire in detail, and to make a sign diagnosis to predict the time when the wear amount reaches the limit. In order to perform such a sign diagnosis, for example, only the periodic checks by the inspection car about once every six months, the data amount is not sufficient. Therefore, it is desired to collect inspection data of trolley wire with passenger cars by installing a trolley wire inspection apparatus in passenger cars that is always on service. In that case, there is no space for installing the control unit of the trolley wire inspection apparatus in the passenger car, so it is necessary to install the entire trolley wire inspection apparatus on the roof of the passenger car. However, when installing the trolley wire inspection apparatus on the roof of the passenger car, due to the radiant heat of the sunlight and due to the heat generated from devices inside the apparatus, the temperature of the equipment of the control unit becomes higher than the operation temperature, there is a risk of not working. On other hand, in cold climates, conversely, the temperature of the equipment of the control unit falls below the operating temperature, which may cause the equipment to not operate properly. Therefore, it is necessary to adjust the temperature of the control unit. But, since there is only a space of about 300 to 400 mm in height between the rooftop of the passenger car and the trolley wire, large-scale air conditioning equipment could not be installed.

An object of the present invention is to effectively control the temperature of a control unit of a railway equipment inspecting and measuring apparatus and install the control unit of the railway equipment inspecting and measuring on the roof of the passenger car.

Disclosure of the Invention

The future of a railway equipment inspecting and measuring apparatus according to the present invention is to comprise a heat insulating case that forms a first space between itself and a control unit of the apparatus inspecting and measuring an inspection object, and seals the periphery of the control unit with heat insulating materials, a cover that forms a second space between itself and the heat insulating case by covering the heat insulating case with itself, and a temperature adjustment unit provided in the area across the first and second spaces, which has a heat exchange element, wherein, the surface of the cover is coated with a heat-resistant coating, and the cover has a suction port that sucks the air from outside into the second space and an exhaust port that discharges the air from inside of the second space to the outside, and the temperature adjustment unit has heat conduction members that conduct heat between the air in the first and second spaces and the heat exchange element, and fans that transfer the air inside the first and second spaces, and the control unit is installed on a rooftop of a passenger car.

The future of a railway equipment inspecting and measuring method according to the present invention is to comprise the following steps of, installing a control unit of a railway equipment inspecting and measuring apparatus on a rooftop of a passenger car, forming a first space between the control unit and a heat insulating case by sealing the periphery of the control unit with the heat insulating case that includes heat insulating materials, forming a second space between the heat insulating case and a cover by covering the heat insulating case with the cover, providing a temperature adjustment unit across the first and second spaces, which has a heat exchange element, heat conduction members, and fans, coating the surface of the cover, with a heat-resistant coating, providing a suction port that sucks the air from outside to inside of the second space in the cover, and providing an exhaust port that discharges the air from inside of the second space to outside in the cover, conducting heat between the air in the first and second spaces and the heat exchange element through the heat conduction members, and while moving the air in the first and second spaces by the fans, inspecting and measuring an inspection object by the apparatus.

The radiant heat of the direct sunlight is blocked by the cover coated with the heat-resistant coating on the surface of the cover and the heat insulating case including the heat insulating materials, and is not conducted into the heat insulating case. In the situation of cooling the control unit in the heat insulating case, the heat of the air in the first space is conducted to the low temperature side of the heat exchange element by the heat conduction member, the air in the space is cooled. Then, the cooled air in the first space is circulated by the fan, and cools the equipment of the control unit. In the second space between the heat insulating case and the cover, the heat on the high temperature side of the heat exchange element is conducted to the air in the second space by the heat conduction member and discharged to the second space. Then, the heat released into the second space is diffused together with the air in the second space by the air sent from the suction port into the second space by the fan.

On the other hand, in cold climates, the external air is blocked by the cover and the heat insulating case including the heat insulating materials and does not reach the heat insulating case. In the situation of heating the control unit in the heat insulating case, the heat on the high temperature side of the heat exchange element is conducted to the air in the first space by the heat conduction member, the air in the first space is warmed up. Then the warmed air in the first space is circulated by the fan to heat the equipment of the control unit. In the second space between the heat insulating case and the cover, the heat of the air in the second space is conducted to the low temperature side of the head exchange element by the heat conducting member and the air in the second space is cooled. Then, the cooled air in the second space is diffused, sent by the suction port into the second space by the fan. By these operations, the temperature control of the control unit of the railway equipment inspecting and measuring apparatus is effectively performed, and the control unit of the railway equipment inspecting and measuring apparatus is installed on the roof of the passenger car normally operated.

The further future of the railway equipment inspecting and measuring apparatus according to the present invention is that the heat insulating case has a rack, which is based for mounting said control unit, and has an opening in its mounting surface, the temperature adjustment unit has a first heat conduction member provided inside the first space, a first fan provided inside the first space, a second heat conduction member provided inside the second space, and a second fan provided inside the second space, and the first fan is provided below the rack, and circulates the air inside the first space from below the control unit through the opening to above the control unit.

The further future of the railway equipment inspecting and measuring method according to the present invention is to comprise the following steps of, installing a rack inside the heat insulating case, providing an opening in the mounting surface of the rack, mounting the control unit on the rack, installing a first heat conduction member inside the first space for conducting heat between the air inside the first space and the heat exchange element, installing a first fan below the rack inside the first space, and circulating the air inside the first space from below the control unit through the opening to above the control unit with the first fan, installing a second heat conduction member inside the second space for conducting heat between the air inside the second space and the heat exchange element, and installing a second fan in the second space, and diffusing the air inside the second space by blowing the air from the suction port into the second space with the second fan.

The heat conduction between the air in the first and second spaces and the heat exchange element and the movement of the air in the first and second spaces are efficiently performed, the heat generated from the equipment of the control unit inside the first space or the heat of the air in the first space heated by the heat exchange element efficiently moves from the lower side of the control unit to the upper side, and the temperature control of the control unit is performed efficiently.

The further future of the railway equipment inspecting and measuring apparatus according to the present invention is that the cover has ventilation holes on the front surface and rear surface in the running direction of the passenger car, and the ventilation holes on the front surface of the cover in the running direction suck the air from outside of the cover into the second space when the passenger car is running.

The further future of the railway equipment inspecting and measuring method according to the present invention is to comprise the following steps of, providing ventilation holes on the front and rear surfaces of the cover in the running direction of the passenger car, and when the passenger car is running, sucking the air from outside of the cover into the second space through the ventilation holes provided on the front surface in the running direction of the passenger car.

Diffusion of the air in the second space is promoted with the flow of the air taken into the second space from the ventilation hole.

The further future of the railway equipment inspecting and measuring apparatus according to the present invention is that the heat exchange element is made of a Peltier device.

The further future of the railway equipment inspecting and measuring method according to the present invention is to comprise the following steps of, using a Peltier device as said heat exchange element.

By using the Peltier device as the heat exchange element, the apparatus is downsized and it is easy to install on the rooftop of the passenger car.

The further future of the railway equipment inspecting and measuring apparatus according to the present invention is that a plurality of the temperature adjustment units are equipped, and the heat insulating case has partition plates that assign each equipment of the control unit to one of the temperature adjustment units.

The further future of the railway equipment inspecting and measuring method according to the present invention is to comprise the following steps of, providing a plurality of the temperature adjustment units, and installing partition plates inside the heat insulating case, and assigning each equipment of the control units to one of the temperature adjustment units by the partition plates.

It is possible to precisely control the temperature of each equipment of the control unit by changing the adjustment temperature for each temperature adjustment unit.

Effect of the Invention

According to the present invention, it is possible to effectively control the temperature of the railway equipment inspecting and measuring apparatus and to install the control unit of the railway equipment inspecting and measuring apparatus on the rooftop of the passenger car.

Furthermore, by installing the rack inside the heat insulating case, by providing the opening in the mounting surface of the rack, by mounting the control unit on the rack, by installing the first heat conduction member inside the first space for conducting heat between the air inside the first space and the heat exchange element, by installing the first fan below the rack inside the first space, and circulating the air inside the first space from below the control unit through the opening to above the control unit with the first fan, by installing the second heat conduction member inside the second space for conducting heat between the air inside the second space and the heat exchange element, by installing the second fan in the second space, and by diffusing the air inside the second space by blowing the air from the suction port into the second space with the second fan, it is possible to efficiently conduct the heat conduction between the air in the first and second spaces and the heat exchange element and the movement of the air in the first and second spaces are efficiently performed, and the temperature adjustment of the control unit in the first space can be efficiently performed.

Furthermore, by providing ventilation holes on the front and rear surfaces of the cover in the running direction of the passenger car, and when the passenger car is running, by sucking the air from outside of the cover into the second space through the ventilation holes provided on the front surface in the running direction of the passenger car, the diffusion of the air in the second space can be promoted with the flow of the air taken into the second space from the ventilation hole.

Furthermore, by using the Peltier device as the heat exchange element, it is possible to reduce the size of the apparatus and make it easy to install it on the rooftop of the passenger car.

Furthermore, by assigning each equipment of the control units to one of the temperature adjustment units by the partition plates, it will be possible to precisely control the temperature of each equipment of the control unit by changing the adjustment temperature for each temperature adjustment unit.

DETAILED DESCRIPTION OF THE PREFERRED EMBODIMENTS

Figure 1:
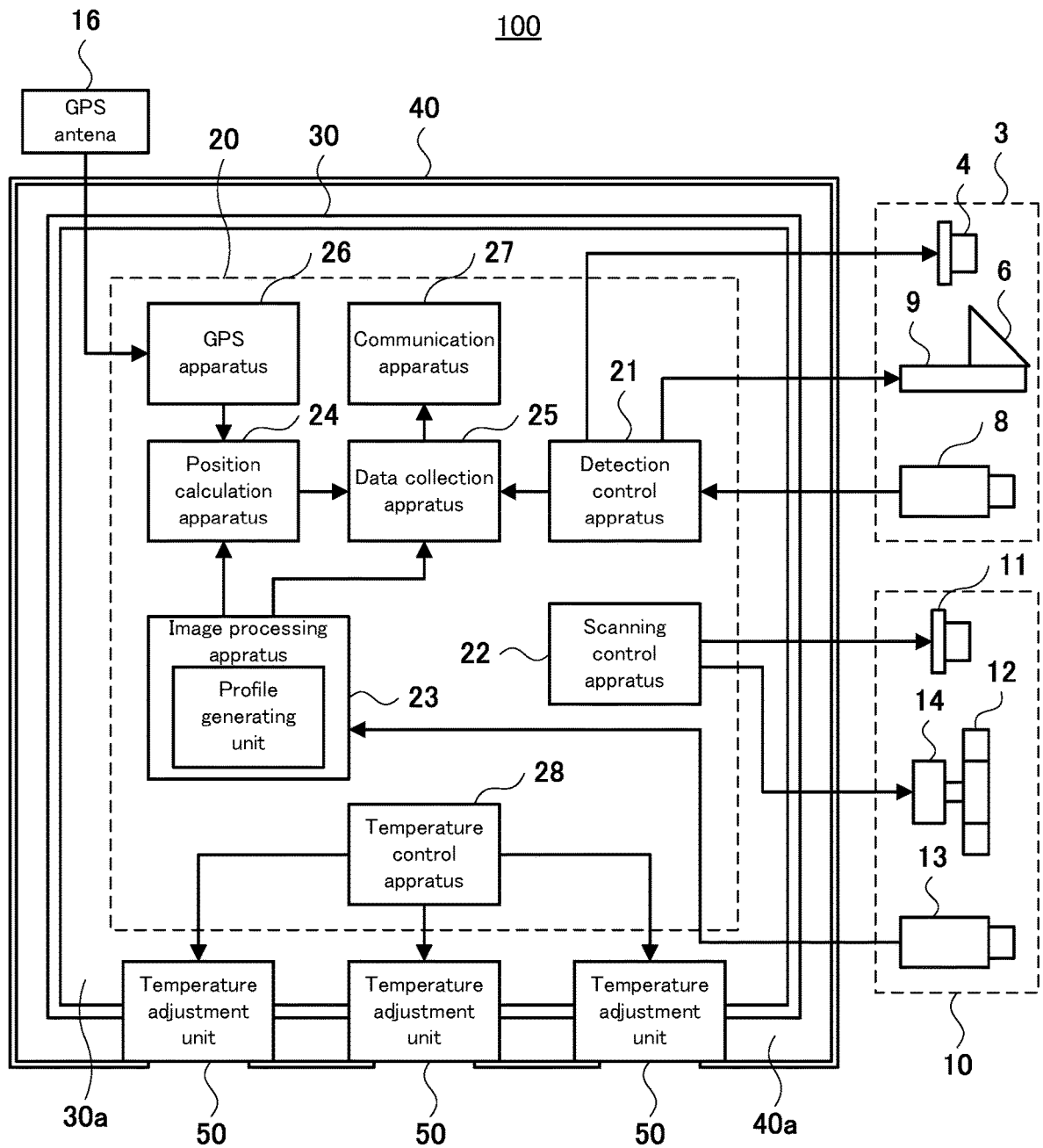
FIG. 1 A diagram showing a schematic configuration of the trolley wire inspection apparatus according to an embodiment of the present invention.

Hereinafter, the railway equipment inspecting and measuring apparatus and the railway equipment inspecting and measuring method of the present invention will be describe in detail by taking a trolley wire inspection apparatus as example. FIG. 1 is a diagram showing a schematic configuration of the trolley wire inspection apparatus according to an embodiment of the present invention. The trolley wire inspection apparatus 100 of the present embodiment is configured to include trolley wire sensor unit 3, a structure sensor unit 10, a GPS antenna 16, a heat insulating case 30. A cover 40, and a temperature adjustment unit 50.

(Trolley Wire Sensor Unit)

Figure 2:
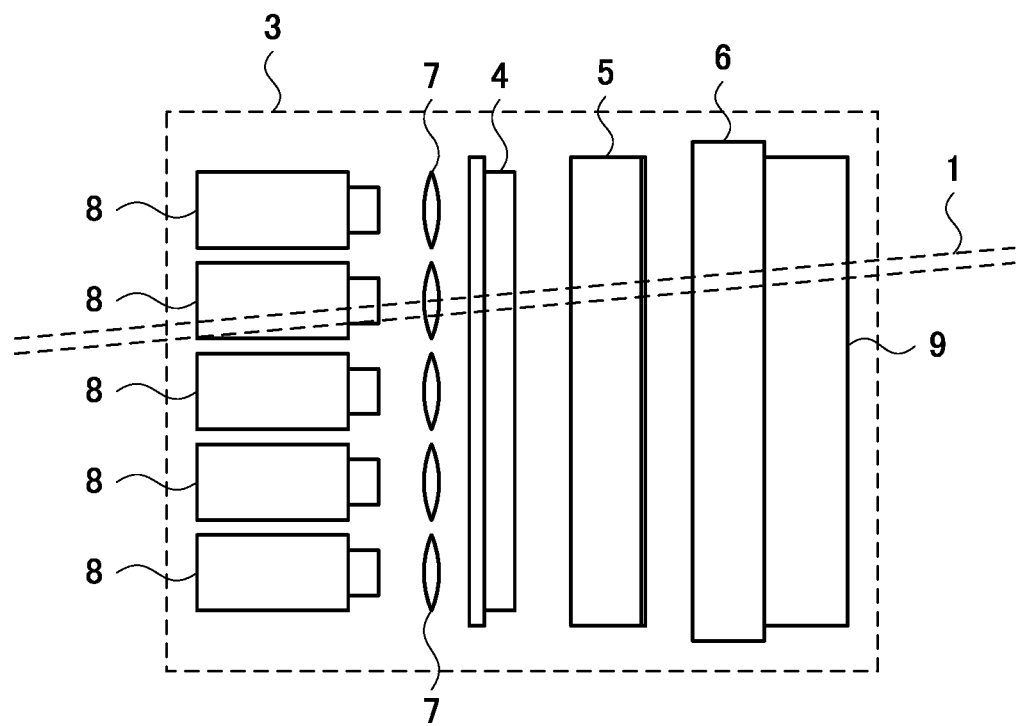
FIG. 2 A diagram showing a configuration example of the trolley wire sensor unit.
Figure 2:
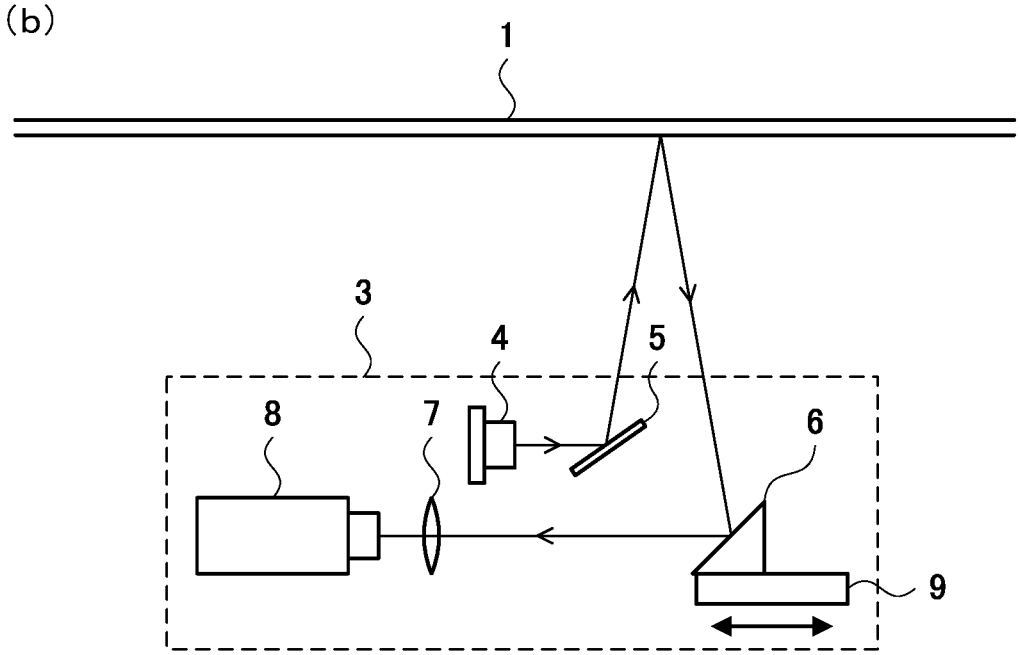

FIG. 2 is a diagram showing a configuration example of the trolley wire sensor unit, wherein FIG. 2 (a) is a top view and FIG. 2 (b) is side view. The trolley wire sensor unit 3 includes a light projector 4, mirrors 5 and 6, a lens 7, a sensor 8 and a mirror position adjusting apparatus 9, and is installed on a roof of a passenger car. In FIG. 2 (a) in the upper above the trolley wire sensor unit 3 installed on the roof of the passenger car, the trolley wire 1 indicated by the broken line is zigzagged in order to prevent the local wear of the pantograph collector boat it's laid. The projector 4 has a plurality of light sources composed, for example, light emitting diodes (LED) or the light in the longitudinal direction, and generates slit-like inspection light having uniform light amount.

In FIG. 2 (b), the inspection light generated from the light projector 4 is reflected by the mirror 5 and irradiated to the trolley wire 1, and reflected light is generated from the trolley wire 1. The reflected light from, the trolley wire 1 is reflected by the mirror 6, is converged by the lens 7, and is irradiated to any one of plurality of sensor 8. Each sensor 8 is composed 0f, for example, a CCD line sensor or something like that, and outputs a detection signal corresponding to the intensity of the received reflected light. The cross section of the sliding portion at the lower end of the trolley wire 1 is substantially arcuate, and when worn, the area of the flat portion increases, and the reflected light generated from the trolley wire 1 is increases. In the example of FIG. 2, five lenses 7 and five sensors 8 are provided, but the number no limited by lenses 7 and sensors 8.

(Stricture Sensor Unit)

Figure 3:
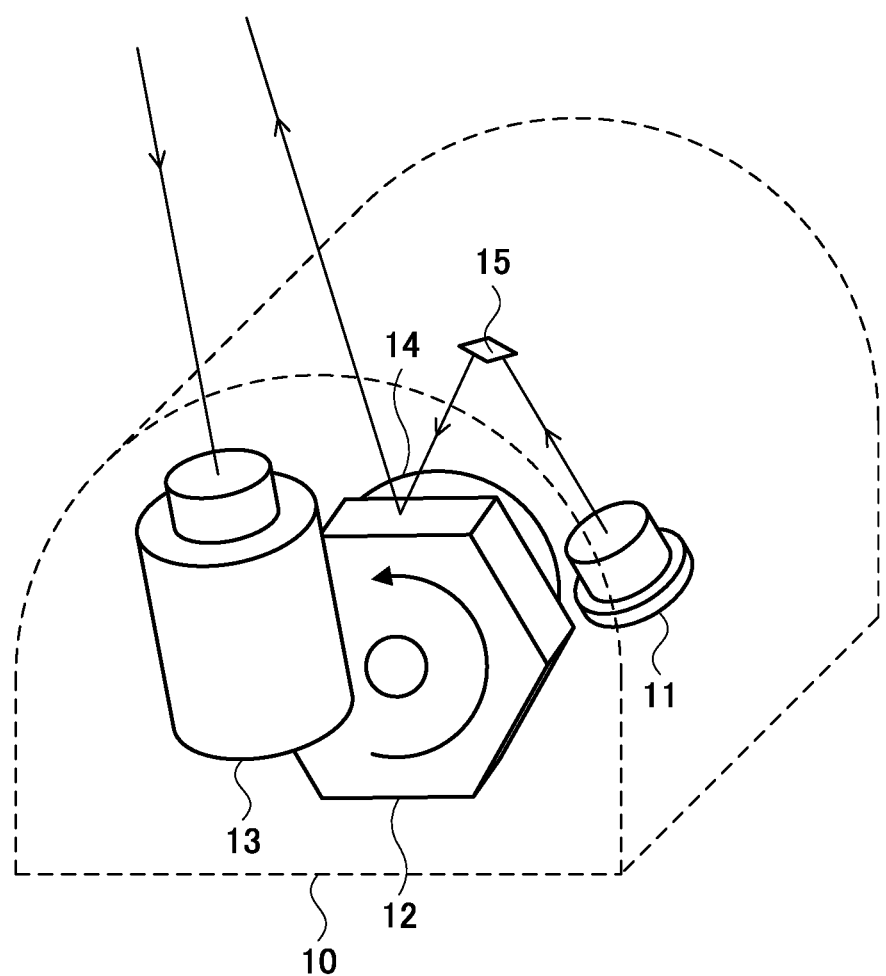
FIG. 3 A perspective view showing a configuration example of the structure sensor unit.

FIG. 3 is a perspective view showing a configuration example of the structure sensor unit. The structure sensor unit 10 includes a laser light source 11, a scanning apparatus 12, a camera 13, a motor 14, and mirror 15 and is installed on a roof of passenger car. To pairs of the laser light source 11, the scanning 12, the camera 13, the motor 15 are provided for the structure sensor unit 10 for the structures on the left and right sides of the trolley wire 1, in FIG. 3, only one of them is shown.

The laser light source 11 is made of, for example, a laser diode or something like that and generates a laser beam. The laser beam generated from the laser light source 11 is reflected by the mirror 15 and irradiated to the scanning apparatus 12. It should be noted that the laser beam may be directly irradiates from the laser light source 11 to the scanning apparatus 12 without using a mirror. The scanning apparatus 12 is made of, for example, a polygon mirror or something like that, and reflects the laser beam while rotating by the motor 14. The motor 14 is, for example, a DC brushless motor or something like that, and rotates the scanning apparatus 12 at a high speed. The laser beam reflected by the scanning apparatus 12 is irradiated from the structure sensor unit 10 to the periphery of the railroad track, and as the scanning apparatus 12 rotates, the laser beam is reflected by a structure such as a pillar or a utility pole around the line. The camera 13 is composed of, for example, a CCD camera or something like that, and the laser beam receives the scattered light scattered by the structure around the line and outputs the image signal.

(Control Unit)

About FIG. 1, the control unit 20 includes a detection control apparatus 21, a scanning control apparatus 22, an image processing apparatus 23, a position calculation apparatus 24, a data collection apparatus 25, a GPS apparatus 26, a communication apparatus 27, and a temperature control apparatus 28 is configured. The detection control apparatus 21 supplies the driving current to the light projector 4 of the trolley wire sensor unit 3 to generate the inspection light and controls the mirror position adjusting apparatus 9 of the trolley wire sensor unit 3 until the position of the mirror 6. The detection control apparatus 21 detects the wear amount of the trolley wire 1 based on detection signal output from the sensor 8 of the trolley wire sensor unit 3. The detection control apparatus 21 outputs the detected wear amount of the trolley wire 1 to the data collection apparatus 25.

The scanning control apparatus 22 supplies a driving current to the laser light source 11 of the structural sensor unit 10 to generate a laser beam and a driving current to the motor 14 for rotating the scanning apparatus 12 of the structural sensor unit 10. The image processing apparatus 23 has a profile generating unit which processes the image signal output from camera 13 of the sensor unit 10 for a structure and generates a profile of a structure such as a pillar or a utility pole around the line generate profile (profile). Then, the image processing apparatus 23 the shape of the structure around the track from the generated profile, and recognizes the structure. The image processing apparatus 23 output the generated profile to the data collecting apparatus 25.

The position computing apparatus 24 detects the position of the trolley wire from the structure recognized by the image processing apparatus 23. For example, by counting the number of utility poles beside the track on which the passenger car 2 is running, it is possible to detect the position of the passenger car 2 on the track, that is, the position of the trolley wire being detected. Further, in the section without the structure, the position computing unit 24 detects the position of the trolley wire based on the position information from the GPS unit 26. Information on the position of the trolley wire detected from the structure around the track has higher accuracy than the position information from the GPS apparatus 26. The position calculating apparatus 24 outputs the detected position of the trolley wire to the data collecting apparatus 25.

The data collecting apparatus 25 collects the data of the wear amount of the trolley wire 1 output from the detection control apparatus 21, the data of the profile of the structure outputted from the image processing apparatus 23, and the position of the trolley wire output from the position calculating apparatus 24. The data is transmitted to the terrestrial base station terminal and/or the cloud server via the communication apparatus 27. The temperature control apparatus 28 supplies a drive current to the heat exchange element of the temperature adjustment unit 50, which will be described later, and changes the polarity of the drive current to change the high temperature side and the low temperature side of the heat exchange element.

(Heat Insulating Case, Cover, and Temperature Adjustment Unit)

A heat insulating case 30 is provided around control unit 20. The heat insulating case 30 from a first space 30 between the heat insulating case 30 and the control unit 20 and surrounds the control unit 20 with a heat insulating material. A cover 40 is provided around the heat insulating case 30.

The cover 40 covers the heat insulating case 30 by forming a second space 40 between the cover 40 and the heat insulating case 30. Then, across the first space 30 a formed between the control unit 20 and the heat insulating case 30 and the second space 40 a formed between insulating case 30 and the cover 40, inside the heat insulating case 30 and a temperature adjusting unit 50 for adjusting the temperature of the air.

(Appearance of Trolley Wire Inspection Apparatus)

Figure 4:
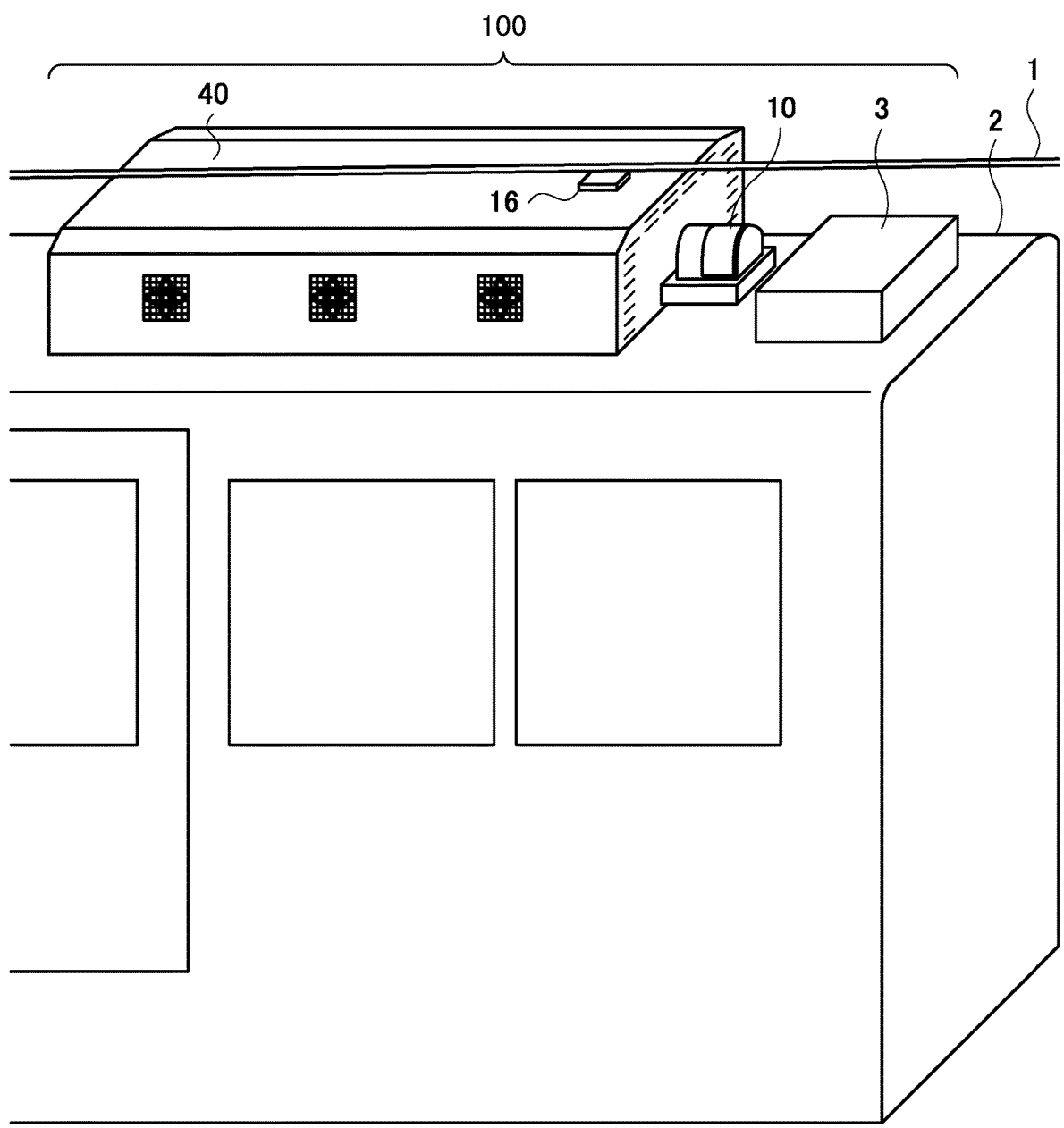
FIG. 4 A perspective view of the trolley wire inspection apparatus installed on the rooftop of the passenger car.

The trolley wire inspection apparatus of the present embodiment is installed on the rooftop of a passenger car of a railway. FIG. 4 is a perspective view of the trolley wire inspection apparatus installed on the rooftop of the passenger car. The external appearance of the trolley wire inspection apparatus 100 is composed of a trolley wire sensor unit 3, a structure sensor unit 10, a GPS antenna 16, and a cover 40. Trolley wire 1 is laid over the trolley wire inspection apparatus 100 installed on the roof of the passenger car 2.

Figure 5:
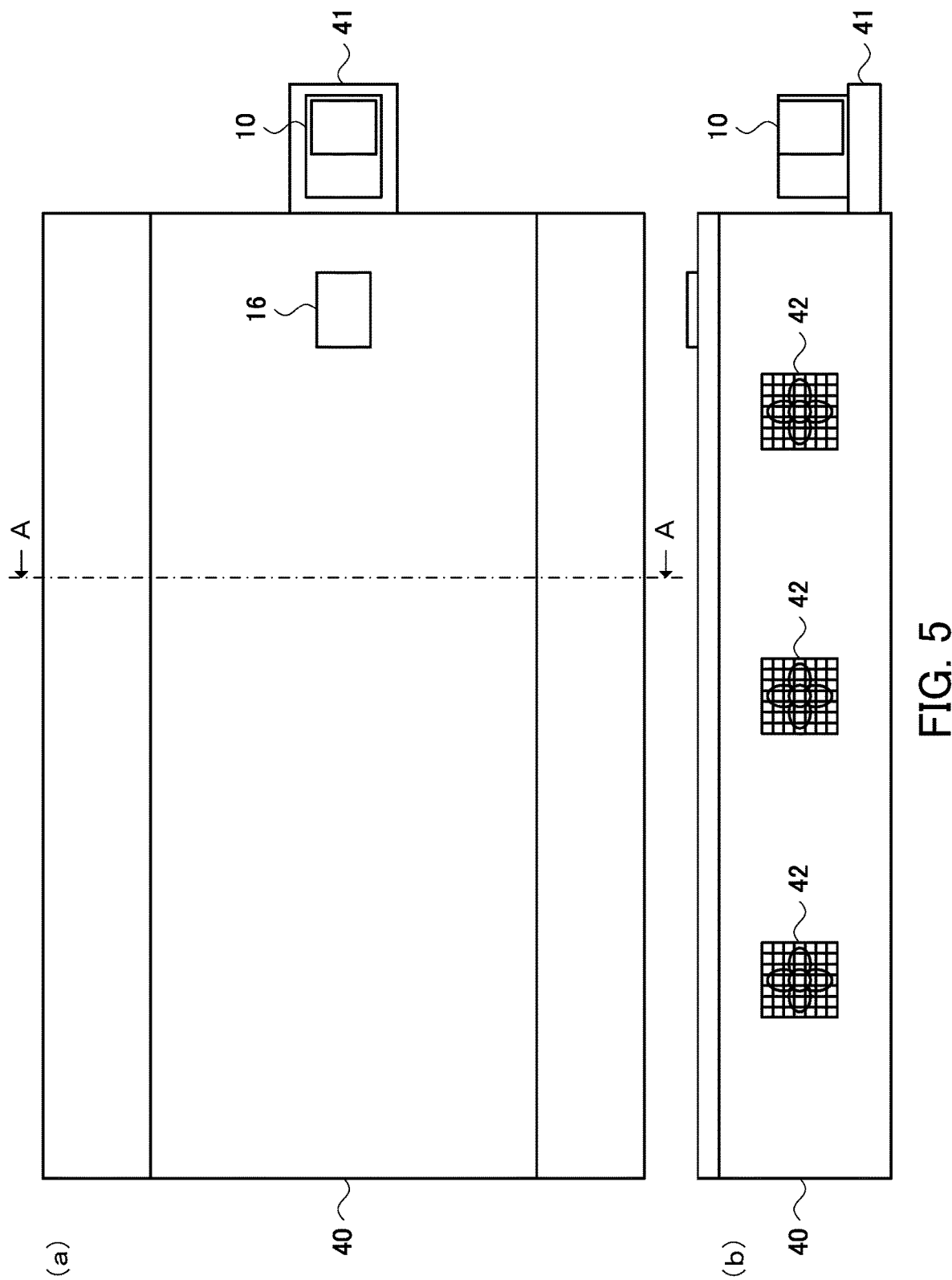
FIG. 5 (a) A top view of the cover, FIG. 5 (b) A side view of the cover.

FIG. 5 (*a*) is a top view of the cover, and FIG. 5 (*b*) is a side view of the cover. The cover 40 is made of, for example, an alloy material such as stainless steel. Inside the cover 40, the heat insulating case 30 of FIG. 1 is housed. A heat shielding paint is applied to the surface of the cover 40, and coated with the heat shielding paint suppresses radiation heat from direct sunlight to the heat insulating case 30. Here, the term "heat-resistant coating" refers to a coating that efficiently reflects infrared rays from the sun and reduces the influence of sunlight heat. In FIGS. 5 (*a*) and 5 (*b*), an installation base 41 is attached to the right side of the cover 40, and the structure sensor unit 10 is mounted on the installation base 41. In FIG. 5 (*b*), one side of the cover 40 is provided with suction ports 42 for sucking air from the outside into the second space 40*a*.

Figure 6:
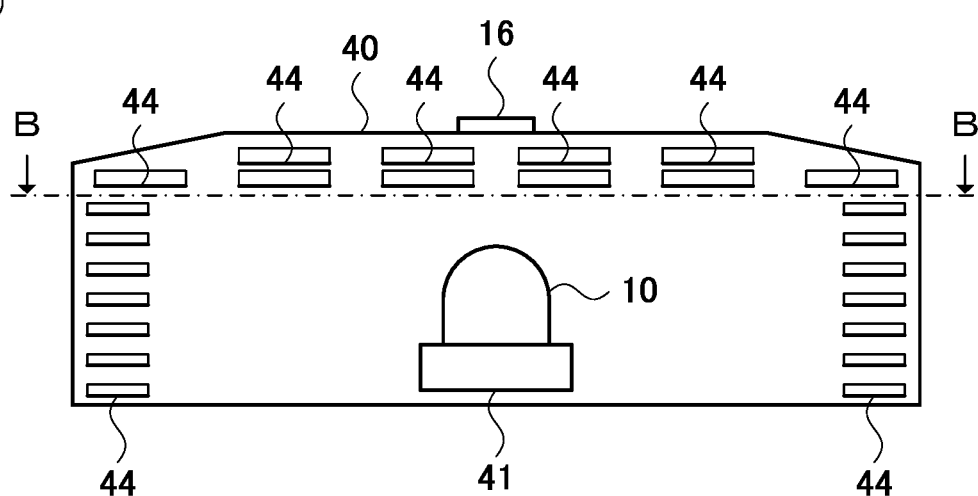
FIG. 6 (a) A front view of the cover, FIG. 6 (b) A cross sectional view of the ventilation hole.
Figure 6:
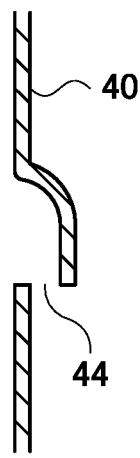

FIG. 6 (*a*) A front view of the cover. On the front face of the cover 40, a plurality of ventilation holes 44 are provided similarly, a plurality of ventilation holes 44 are also provided on the track surface of the cover 40. When the passenger car 2 on which the trolley wire inspection apparatus 100 is installed is stopped, the air sucked into the second space 40 from the suction port 42 of the cover 40 is exhausted from the exhaust port of the cover 40 described later and the front face of the cover 40 and ventilation holes 44 provided on the back surface. When traveling on the passenger car 2, separately from the air sucked into the second space 40*a* from the suction port 42 of the cover 40, also from the ventilation hole 44 provided in the front in the travel direction into the second space 40*a*, the air is taken in, and these air is discharge from the exhaust port of a cover 40 (to be described later) and the ventilation hole 44 provided on the reverse side on the opposite side. FIG. 6 (*b*) is a cross sectional view of the ventilation hole. As shown in FIG. 6 (*b*), the ventilation hole 44 is formed with a through hole facing downward and has a structure that rain, snow, dust, and the like are hard to enter.

(Temperature Control Function of Temperature Adjustment Unit)

Figure 7:
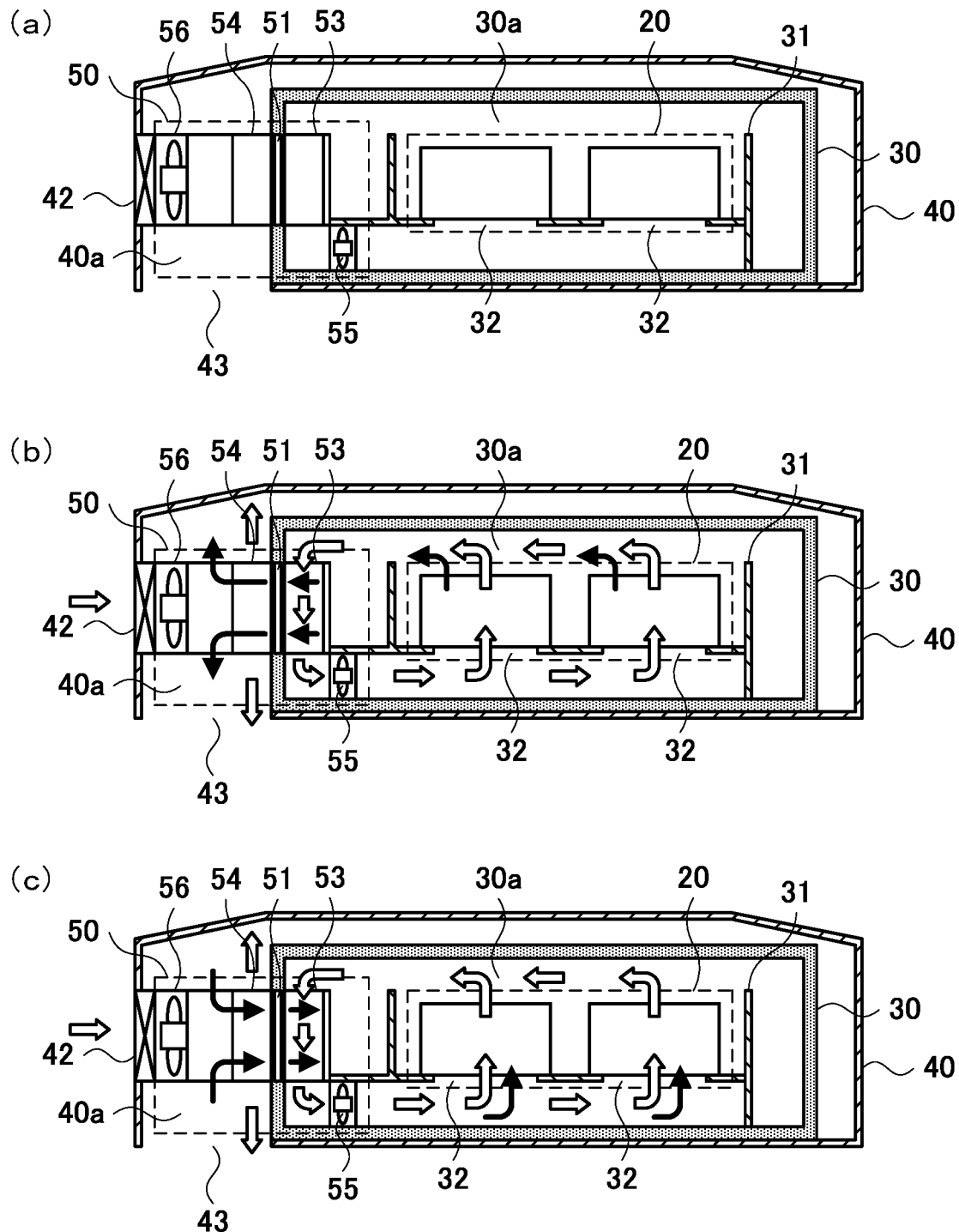
FIG. 7 (a) A cross sectional view taken along the line A-A in FIG. 5 (a), FIGS. 7 (b) and (c) Drawings for explaining the air flow and the movement of heat in the first and second spaces.
Figure 8:
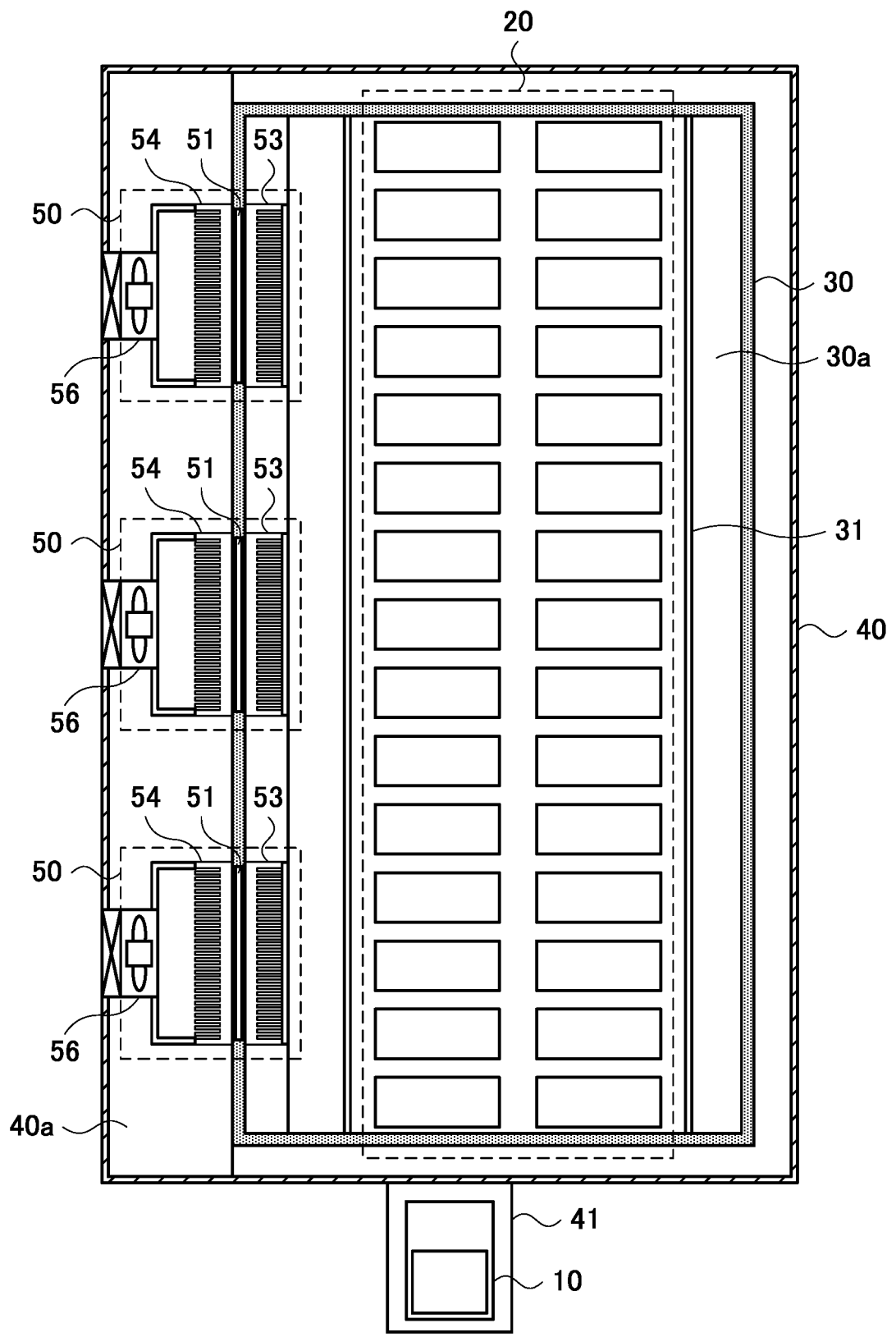
FIG. 8 A cross section view taken along line B-B in FIG. 6 (a).

FIG. 7 (*a*) is a cross sectional view taken along the line A-A in FIG. 5 (*a*). An exhaust port 43 for discharging the air in the second space a formed between the heat insulating case 30 and the cover 40 to the outside is provided on the bottom surface of the cover 40. A shelf board 31 is disposed inside the heat insulating case 30 housed in the cover 40, and an opening 32 is provided on the mounting surface of the shelf board 31. The control unit 20 is mounted on the mounting surface of the shelf table 31. The first space 30*a* formed between the control unit 20 and the heat insulating case 30 and the second space 40*a* formed between the heat insulating case 30 and the cover 40 are arranged in the depth direction of the drawing A plurality of temperature adjustment units 50 are installed. FIG. 8 is a cross section view taken along line B-B in FIG. 6 (*a*). In the present embodiment, three temperature adjustment units 50 are provided, but the number of the temperature adjustment units 50 is not limited to this, but is appropriately determined according to the required temperature adjustment capability.

Figure 9:
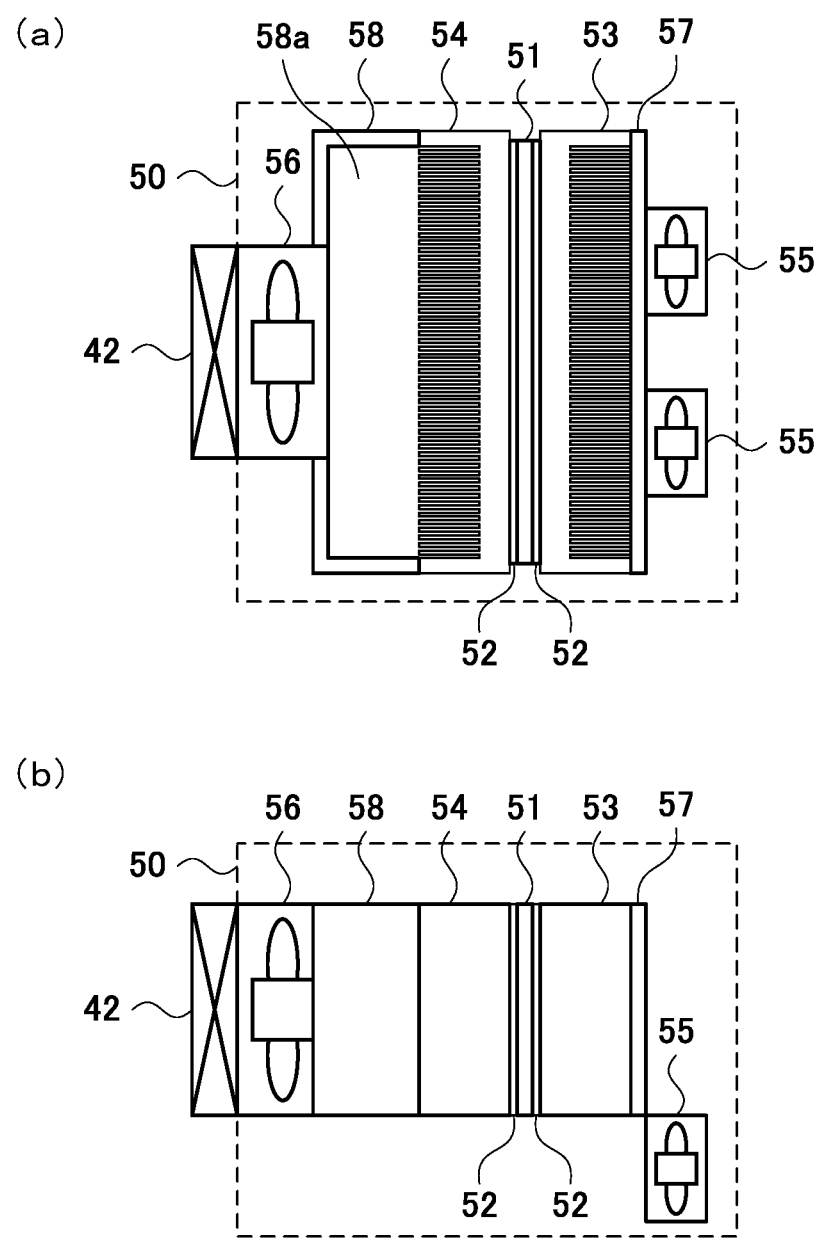
FIG. 9 A diagram showing a configuration of the temperature adjustment unit.

FIG. 9 is a diagram showing a configuration of the temperature adjustment unit, wherein FIG. 9 (*a*) is a top view and FIG. 9 (*b*) is a side view. The temperature adjustment unit 50 includes a heat exchange element 51, a thermal conduction sheet 52, an inner fin 53 (a first heat conduction member), an outer fin 54 (a second heat conduction member), a circulation fan (a first fan) and a ventilation fan 56 (second fan). The heat exchange element 51 is composed of, for example, a Peltier device, and a drive current is supplied from the temperature control apparatus 28 in FIG. 1, on the surface on the right side of the heat exchange element 51 in the drawing, an inner fin 53 is attached with a thermal conduction sheet 52 interposed there between. An outer fin 54 is attached to the surface of the heat exchange element 51 on the left side in the drawing with the heat condition sheet 52 interposed there between. The inner fin 53 and the outer fin 54 are made of a material having high thermal conductivity such as aluminum, for example, and a large number of plate like projections are provided in order to widen the contact area with the air. For the heat conduction sheet 52, for example, a sheet or the like made of a phase change material (phase change material) that change into a liquid phase having fluidity at a use temperature is used as the sheet at room temperature. Instead of the heat conduction sheet 52, grease may be used. The ventilation fan 56 is connected to the suction port 42 of the cover 40. In the present embodiment, two circulation fans 55 are provided in one temperature adjustment unit 50, but the member of circulation fans is not limited to this.

In FIG. 7 (*a*), the inner fin 53 is provided in the first space 30*a*, and conducts heat between the air in the first space 30*a* and the heat exchange element 51. The circulation fan 55 is provided in the first space 30*a* and circulates the air in the first space 30*a*. The outer fin 54 is provided in the second space 40*a* and conducts heat between the air in the second space 40*a* and the heat exchange element 51. The ventilation fan 56 is provided in the second space 40*a* and diffuses the air in the second space 40 *a*.

FIG. 7 (*b*) is a drawing for explaining the air flow and the movement of heat in the first and second spaces when cooling the control unit 20, the temperature control apparatus 28 of FIG. 1 controls the temperature of the heat exchange element 51 such that the inner fin 54 side of the heat exchange element 51 becomes lower temperature side and the outer fin 54 side of the heat exchange element 51 becomes higher temperature side. In FIG. 7 (*b*), the white arrow on the inside indicates the flow of air in the first space 30*a* and the second space 40*a*, the black arrow indicates the flow of heat generated from the equipment of the control unit 20 respectively.

Radiant heat due to direct sunlight is block by the cover coated with the heat-resistant coating on the surface and the heat insulating case 30 including the heat insulating material and is not conducted into the heat insulating case 30. In the first space 30*a* in the heat insulating case 30, the heat of the air in the first space 30*a* generated from the equipment of the control unit 20 is conducted to the low temperature side of the heat exchange element 51 by the inner fin 53, and the air in the first space 30*a* is cooled, the cooled air in the first space 30*a* circulates in the first space 30*a* by the circulation fan 55 to cool the equipment of the control unit 20. In the second space 40*a* between the heat insulating case 30 and the cover 40, the heat on the high temperature side of the heat exchange element 51 is conducted to the air in the second space 40 *a* by the outer fin 54, and the second space 40*a*. Then, the heat released into the second space 40*a* is diffused together with the air in the second space 40*a* by the air sent from the suction port 42 into the second space 40*a* by the ventilation fan 56.

FIG. 7 (*c*) is a drawing for explaining the air flow and the movement of heat in the first and second spaces when heating the control unit 20. When heating the control unit 20, the temperature control apparatus 28 of FIG. 1 controls the temperature of the heat exchanging element 51 such the inner fin 53 side of the heat exchanging element 51 is on the high temperature side and the outer fin 54 side if the heat exchanging element 51 is on the low temperature side, 51 in accordance with the polarity of the drive current. In FIG. 7 (*c*), the white arrow on the inside indicates the flow of air in the first space 30*a* and the second space 40*a*, the black arrow indicates the flow of air absorbed by the equipment of the control unit 20 indicating movement.

In a cold district, the external cold air is blocked by the cover 40 and the heat insulating case 30 including the heat insulating material, and does not reach the inside of the heat insulating case 30. In the first space 30*a* in the heat insulating case 30, the heat on the high temperature side of the heat exchange element 51 is conducted to the air in the first space 30*a* by the inner fin 53, and the warm air is added in the first space 30. Then, the air in the heated space 30*a* circulates in the first space 30*a* by the circulation fan 55, and heats the equipment of the control unit 20. In the second space 40*a* between the heat insulating case 30 and the cover 40, the heat of the air in the second space 40*a* is conducted to the low temperature side of the heat exchange element 51 by the outer fin 54, so that the second space 40*a*, air is cooled. Then, the air in the cooled second space 40*a* is diffused by the air sent from the suction port 42 into the second space 40*a* by the ventilation fan 56. Through these operation, the temperature control of the control unit 20 is effectively performed, and the control unit 20 of the trolley wire inspection apparatus 100 installed on the roof of the passenger car 2 is normally operates.

At this time, the table 31 is provided in the heat insulating case 30, the opening 32 is provided in the mounting surface of the shelf table 31, the control unit 20 is mounted on the table 31, the circulation fan 55 is provided below the table 31, the circulation fan 55 circulates the air in the first space 30*a* from the lower side of the control unit 20 to the upper side of the control unit 20 through the opening 32, so that the heat generated from the equipment of the control unit 20 (FIG. 7 (*b*)). Then, (FIG. 7 (*c*)) of the air in the first space 30*a* heated by the heat exchange element 51 efficiently moves from the lower side of the control unit 20 to the upper side, and the temperature of the control unit 20 is efficient and done well.

Further, in FIG. 9, the side surface on the right side of the inner fin 53 is closed by a lid 57, and the upper and lower portions of the inner fin 53 are released so as to allow air to pass there through. As a result, the air in the first space 30*a* is efficiently circulated through the gaps between the protrusions of the inner fins 53. Between the outer fin 54 and the ventilation fan 56, an air passage 58 (*a*) is formed by the lid 58, and the upper portion and the lower portion of the outer fin 54 and the lid 58 are released so as to allow air to pass there through. As a result, the air in the second space 40 (*a*) is efficiently diffused by the wind from ventilation fan 56.

Figure 10:
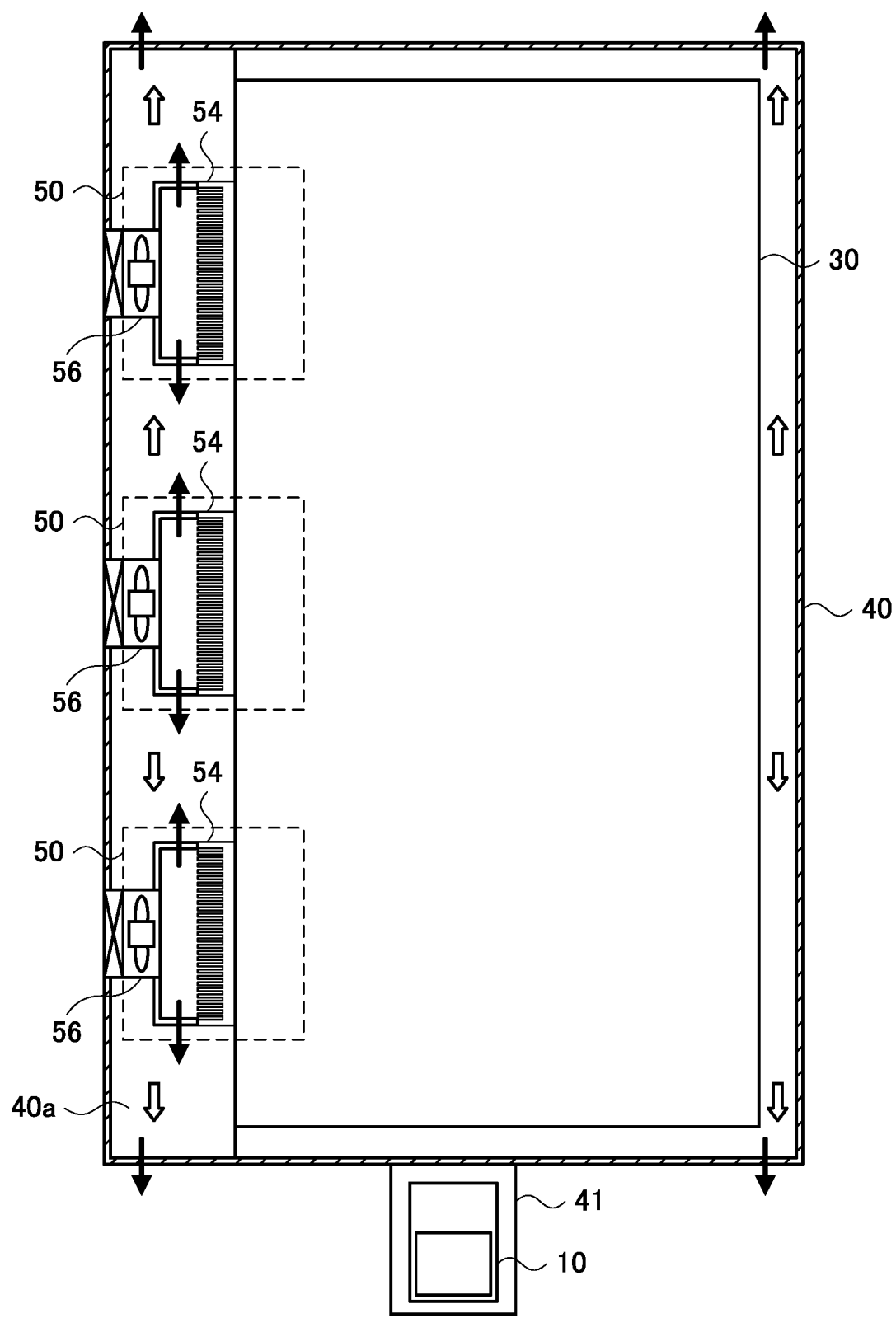
FIG. 10 A drawing for explaining the air flow and the movement of heat in the second space when the passenger car is stopped.

FIG. 10 is a drawing for explaining the air flow and the movement of heat in the second space when the passenger car is stopped. In FIG. 10, the white arrow on the inside indicates the flow of air in the second space 40*a*, and the black arrow indicates the movement of heat in the second space 40*a*. when cooling the control unit 20 inside the heat insulating case 30, the heat generated from the equipment of the control unit 20 in the heat insulating case 30 is released from the inside of the first space 30*a* to the second space 40*a* by the temperature adjusting unit 50 and diffused together with the air in the second space 40*a*. Then, the diffused heat is discharge to the outside of the cover 40 through the exhaust port 43 and the vent hole 44.

Figure 11:
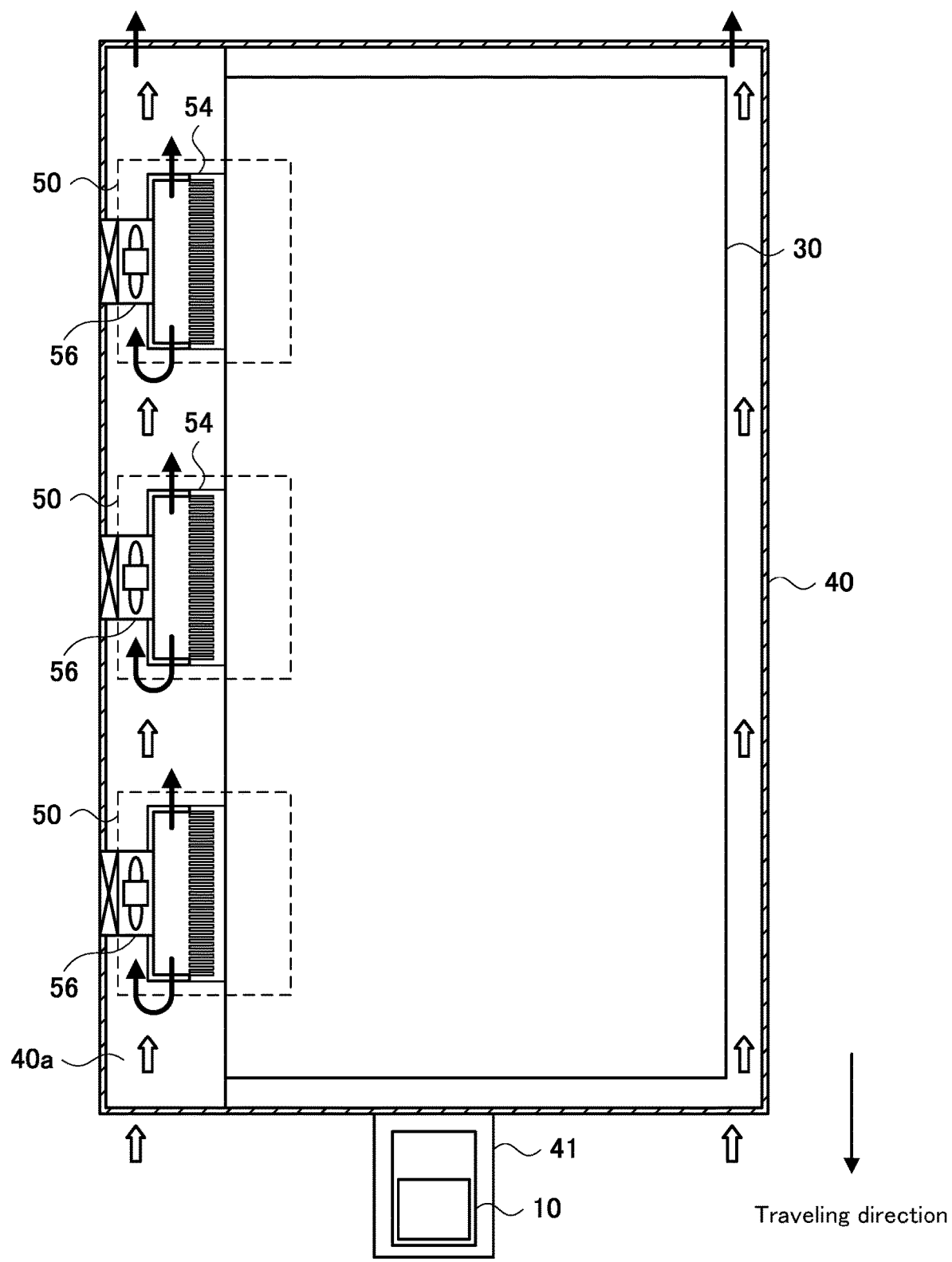
FIG. 11 A drawing for explaining the air flow and the movement of heat in the second space when the passenger car is traveling.

FIG. 11 is a drawing for explaining the air flow and the movement of heat in the second space when the passenger car is traveling. Similar to FIG. 10, in FIG. 11, the white arrow on the inside indicates the flow of air in the second space 40*a*, and the black arrow indicates the movement of heat in the second space 40*a*. when the passenger car 2 travels, air taken in through the ventilation holes 44 provided in front of the cover 40 in the traveling direction forms a flow of air in the second space 40*a* in the direction opposite to the traveling direction. This air flow promotes the diffusion of air in the second space 40*a*.

Figure 12:
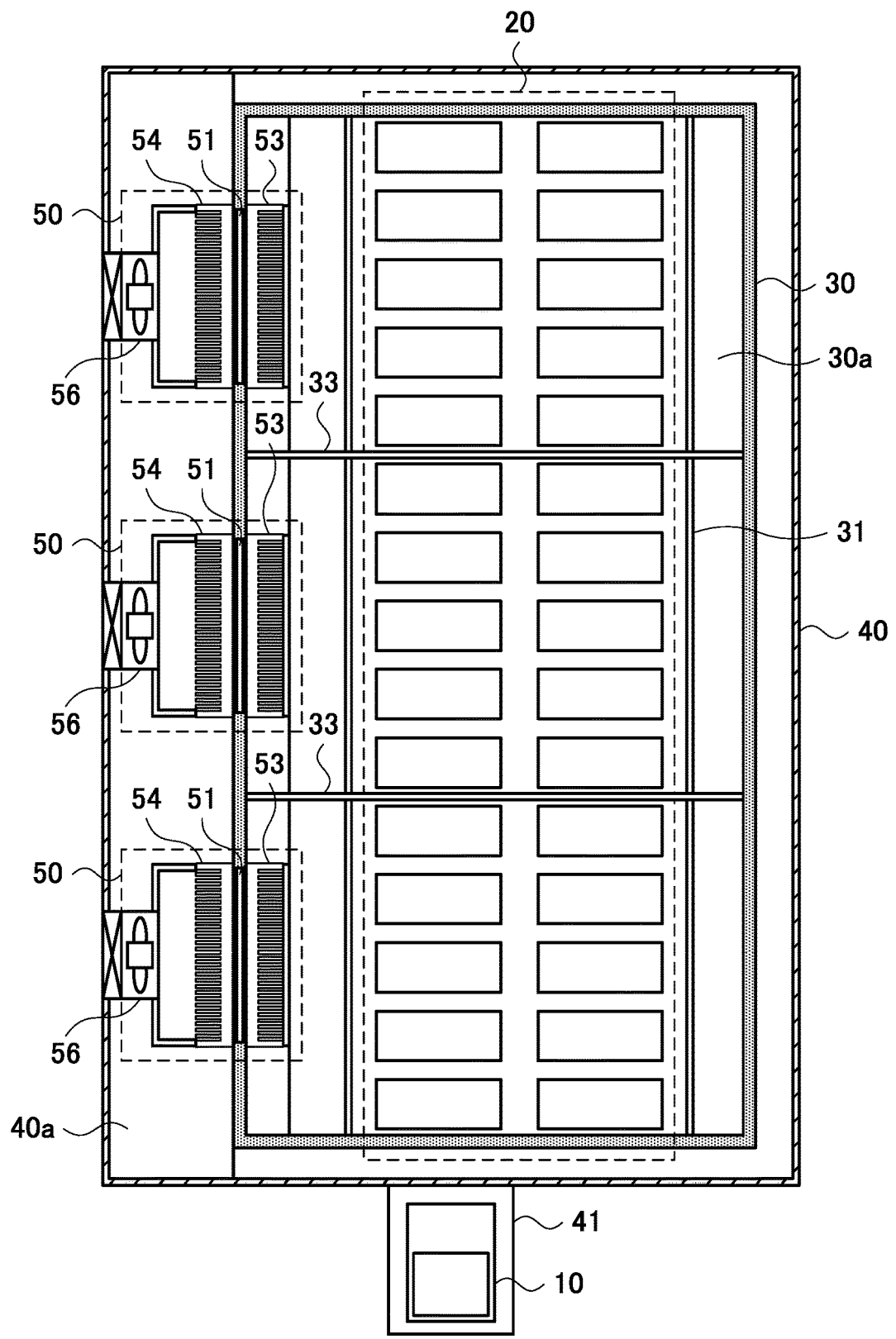
FIG. 12 A drawing showing the inside of the heat insulating case of the trolley wire inspection apparatus according to another embodiment of the present invention.

FIG. 12 is a drawing showing the inside of the heat insulating case of the trolley wire inspection apparatus according to another embodiment of the present invention. In the present embodiment, a partition plate 33 is provided inside the heat insulating case 30 to assign each apparatus of the control unit 20 to any one of the plurality of temperature adjustment units 50. By using the partition plate 33, and allocating each apparatus of the control unit 20 to any one of the plurality of temperature adjustment units 50, the adjustment temperature is changed for each temperature adjustment unit 50, and the temperature control of each apparatus of the control unit 20, it can be done precisely.

Effect of the Embodiments

According to the above described embodiment, the following effects are obtained.

(1) The temperature of the control unit 20 of the trolley wire inspection apparatus 100 can be effectively adjusted, and the control unit 20 of the trolley wire inspection apparatus 100 can be installed on the rooftop of the passenger car 2.

(2) Furthermore, by installing the rack 31 inside the heat insulating case 30, by providing the opening 32 in the mounting surface of the rack 31, by mounting the control unit 20 on the rack 31, by installing the first heat conduction member 53 inside the first space 30*a* for conducting heat between the air inside the first space 30*a* and the heat exchange element 51, by installing the first fan 55 below the rack 31 inside the first space 30*a*, and circulating the air inside the first space 30*a* from below the control unit 20 through the opening 32 to above the control unit 20 with the first fan 55, by installing the second heat conduction member 54 inside the second space 40*a* for conducting heat between the air inside the second space 40*a* and the heat exchange element 51, by installing the second fan 56 in the second space 40*a*, and by diffusing the air inside the second space 40*a* by blowing the air from the suction port 42 into the second space 40*a* with the second fan 56, it is possible to efficiently conduct the heat conduction between the air in the first and second spaces 30*a*, 40*a* and the heat exchange element 51 and the movement of the air in the first and second spaces 30*a*, 40*a* are efficiently performed, and the temperature adjustment of the control unit 20 in the first space 30*a* can be efficiently performed.

(3) Furthermore, by providing ventilation holes 44 on the front and rear surfaces of the cover 40 in the running direction of the passenger car 2, and when the passenger car 2 is running, by sucking the air from outside of the cover 40 into the second space 40*a* through the ventilation holes 44 provided on the front surface in the running direction of the passenger car 2, the diffusion of the air in the second space 40*a* can be promoted with the flow of the air taken into the second space 40*a* from the ventilation holes 44.

(4) Furthermore, by using the Peltier device as the heat exchange element, it is possible to reduce the size of the apparatus and make it easy to install it on the rooftop of the passenger car 2.

Furthermore, according to the embodiment shown in FIG. 12, the following effects are obtained.

(5) By assigning each equipment of the control units 20 to one of the temperature adjustment units 50 by the partition plates 33, it will be possible to precisely control the temperature of each equipment of the control unit 20 by changing the adjustment temperature for each temperature adjustment unit 50.

The railway equipment inspecting and measuring apparatus and the railway equipment inspecting and measuring method according to the present invention are not limited to above described trolley wire inspection apparatus, but may also be applied to a rail inspection apparatus for checking the state, displacement, etc. of rails. It can also be applied to other railway equipment inspection apparatus such as a structure inspection apparatus that inspects surrounding structures or an obstacle inspection apparatus that detects obstacles and the like. Also, by installing the railway equipment inspecting and measuring of the present invention on the roof of the inspection car, it is possible to effectively utilize the space inside the inspection car, which was conventionally occupied by the control unit of the railway inspection apparatus, for other uses.

What is claimed is:

1. A railway equipment inspecting and measuring apparatus, wherein said apparatus comprising:
   a heat insulating case that forms a first space between itself and a control unit of said apparatus inspecting and measuring an inspection object, and seals the periphery of said control unit with heat insulating materials,
   a cover that forms a second space between itself and said heat insulating case by covering said heat insulating case with itself, and
   a temperature adjustment unit provided in the area across said first and second spaces, which has a heat exchange element, wherein:
      the surface of said cover is coated with a heat-resistant coating, and said cover has a suction port that sucks the air from outside into said second space and an exhaust port that discharges the air from inside of said second space to the outside, and
      said temperature adjustment unit has heat conduction members that conduct heat between the air in said first and second spaces and said heat exchange element, and a first fan transfers the air in the first space and a second fan transfers air in the second space, and
      said control unit is installed on a rooftop of a passenger car.

2. The railway equipment inspecting and measuring apparatus as claimed in claim 1, wherein:
said cover has ventilation holes on the front surface and rear surface in the running direction of said passenger car, and
said ventilation holes on the front surface of said cover in the running direction suck the air from outside of said cover into said second space when said passenger car is running.

3. The railway equipment inspecting and measuring apparatus as claimed in claim 1, wherein:
said heat insulating case has a rack, which is based for mounting said control unit, and has an opening in its mounting surface,
said temperature adjustment unit has a first heat conduction member provided inside said first space, a first fan provided inside said first space, a second heat conduction member provided inside said second space, and a second fan provided inside said second space, and
said first fan is provided below said rack, and circulates the air inside said first space from below said control unit through said opening to above said control unit.

4. The railway equipment inspecting and measuring apparatus as claimed in claim 3, wherein:
said cover has ventilation holes on the front surface and rear surface in the running direction of said passenger car, and
said ventilation holes on the front surface of said cover in the running direction suck the air from outside of said cover into said second space when said passenger car is running.

5. The railway equipment inspecting and measuring apparatus as claimed in claim 1, wherein:
said heat exchange element is made of a Peltier device.

6. The railway equipment inspecting and measuring apparatus as claimed in claim 3, wherein:
said heat exchange element is made of a Peltier device.

7. The railway equipment inspecting and measuring apparatus as claimed in claim 4, wherein:
said heat exchange element is made of a Peltier device.

* * * * *